United States Patent [19]

Le Parquier

[11] Patent Number: 4,787,854

[45] Date of Patent: Nov. 29, 1988

[54] CONNECTOR FOR FLAT CONNECTIONS

[75] Inventor: Guy Le Parquier, Paris, France

[73] Assignee: Thomson-CSF, Paris, France

[21] Appl. No.: 64,020

[22] Filed: Jun. 19, 1987

[30] Foreign Application Priority Data

Jun. 24, 1986 [FR] France .................. 86 09102

[51] Int. Cl.⁴ .............................................. H01R 9/09
[52] U.S. Cl. ......................................... 439/67; 439/77;
439/161; 439/932
[58] Field of Search ............... 439/67, 77, 161, 493,
439/932, 595

[56] References Cited

U.S. PATENT DOCUMENTS

| | | | |
|---|---|---|---|
| 3,995,964 | 12/1976 | De Groef | 439/932 |
| 4,022,519 | 5/1977 | Hill | 439/161 |
| 4,426,413 | 1/1984 | Fentress | 439/932 |
| 4,462,651 | 7/1984 | McGaffigan | 439/61 |
| 4,505,500 | 12/1985 | Krumme | |
| 4,634,201 | 1/1987 | Kemka | 439/161 |
| 4,647,125 | 3/1987 | Landi et al. | 439/67 |
| 4,691,972 | 9/1987 | Gordon | 439/77 |
| 4,717,345 | 1/1988 | Gordon et al. | 439/67 |

Primary Examiner—Gil Weidenfeld
Assistant Examiner—Paula A. Austin
Attorney, Agent, or Firm—Oblon, Fisher, Spivak, McClelland & Maier

[57] ABSTRACT

The invention provides a connector for flat connections adapted for connecting electrically together printed circuit tracks or printed circuit tracks to a flat cable or two flat cables together. The connector includes a sleeve made from a shape memory material in which the conducting elements intended to be in electric contact are superimposed. The sleeve is adapted for applying transverse forces under the effect of a predetermined temperature so that electric continuity may be provided between these elements.

5 Claims, 2 Drawing Sheets

FIG_1
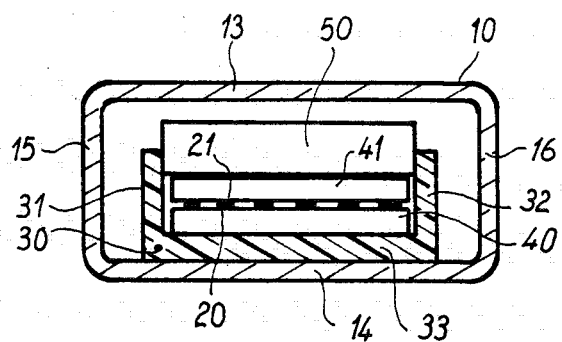
FIG_2
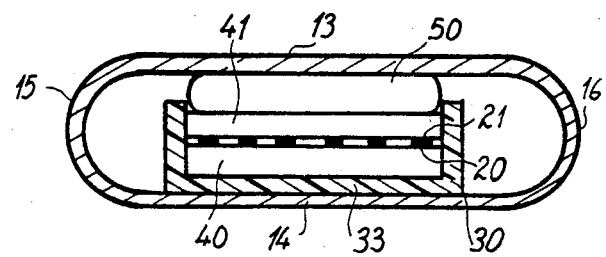

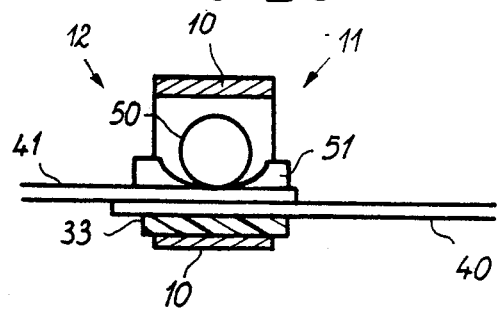
FIG_3
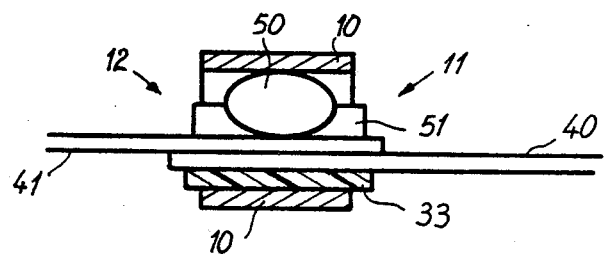
FIG_4
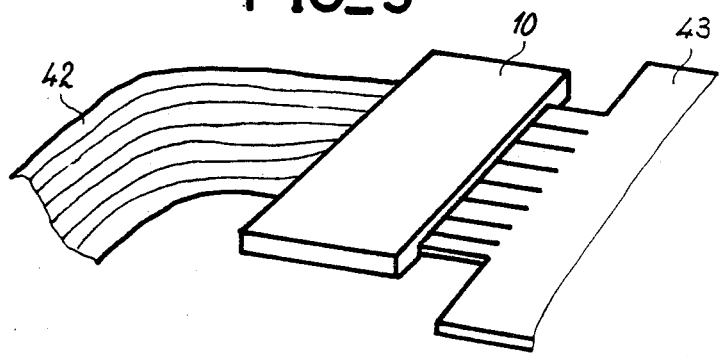
FIG_5

CONNECTOR FOR FLAT CONNECTIONS

FIELD OF THE INVENTION

The present invention relates to connectors for flat connections, more particularly for connecting a flat flexible cable electrically to another cable of the same type or to a printed circuit or two printed circuits together.

BACKGROUND OF THE INVENTION

Connectors are generally used of an elongate shape formed of two parts, a male part and a female part, each part being connected to one of the elements to be joined together.

There are always drawbacks of a mechanical or thermal kind with this type of connector. In fact, when electric connections are formed by such connectors in equipment which is intended to be airborne, for example in aeronautics, they are often subjected to very severe mechanical or thermal conditions which may damage them. Moreover, these connectors always have a non zero insertion and disinsertion force, and the repeated coupling and uncoupling operations may degrade their mechanical or electrical properties.

Furthermore, it is known to use shape memory connectors formed by a preformed split socket about which is slid a heat-shrinkable ring. This type of connector is particularly well adapted to the connection of pin circuits. Each pin is inserted in such a socket and by heating (or cooling) the restraining force of the ring becomes greater than the return force of the socket, the pins then being nipped with a high contact pressure.

However, when it is a question of connecting a flat flexible cable to another flat flexible cable or to a printed circuit or connecting two printed circuits together, this type of connection has the drawback of being cumbersome and ill-adapted to these applications, for the electric connections are not made by pins but by wires or tracks.

SUMMARY OF THE INVENTION

The present invention overcomes these drawbacks by providing a connector for flat connections adapted for connecting electrically together tracks of printed circuits or tracks to a flat cable or two flat cables together. The connector includes a sleeve made from a shape memory material in which the conducting elements intended to be in electric contact are superimposed. The sleeve is adapted for applying transverse forces under the effect of a predetermined temperature so tht electric continuity may be provided between these conducting elements.

The present invention also provides a connector in which the sleeve has two faces parallel to the planes in which the conducting elements are situated, and two lateral sides connecting the two faces together. The faces are able to draw closer together under the effect of a temperature change, and the lateral sides are elastically deformable under the effect of the same temperature change.

BRIEF DESCRIPTION OF THE DRAWINGS

Other features of the invention will be clear from the following description given by way of non limitative example and which is illustrated by the drawings.

FIG. 1 is a diagram of a cross section of a connector of the invention, the connector being in the rest phase.

FIG. 2 is the same section as in FIG. 1, the connector being active.

FIG. 3 is a diagram of a longitudinal section of the connector of the invention, the connector being in the rest phase.

FIG. 4 is the same section as in FIG. 3, the connector being in action.

FIG. 5 is a diagram of a connection between a flat flexible cable and a printed circuit in accordance with the invention.

DESCRIPTION OF THE PREFERRED EMBODIMENTS

FIG. 1 shows a cross section of a flat connector of the invention. The connector includes a sleeve 10 made from a shape memory material and having faces 13 and 14, side 15 and 16, and openings 11 and 12. Conducting elements are inserted in the sleeve 10. In this particular example, the conduction elements are tracks 20,21 of two printed circuits. The tracks 20,21 are placed in facing relationship on each other. They are guided during positioning in the sleeve 10 by a guide 30 placed inside the sleeve 10. The guide 30 has lateral walls 31 and 32 and a bottom wall 33. Supports 40 and 41 for the tracks 20 and 21 are inserted between the lateral walls 31 and 32 of the guide 30. The support 40 carrying the tracks 20 rests on the bottom wall 33 of the guide 30. The guide 30 has the shape of a trough whose two ends are open. Above the support 41 carrying the tracks 21 is placed a resilient seal 50, made for example from elastomer. The resilient seal 50 can, for example, have a cylindrical shape. The resilient seal 50 rests on a wedge-piece 51 shown in FIGS. 3 and 4. The wedge-piece 51 is placed between the lateral walls 32 and 32 of the guide 30 on the support 41.

The longitudinal axis of the resilient 50 is perpendicular to the tracks 20,21. The guide 30 is fixed to the sleeve 10 by adhesive (for example, glue). The sleeve 10 can have a parallelepipedal shape, for example.

The connection consists firstly in fitting the sleeve 10 about the tracks 20,21 of the support 40, then inserting the support 41 inside the sleeve 10 in the guide 30. These operations are carried out at the temperature required so that the sleeve has its initial, so-called rest state. Transformation of this shape may take place either when cold or when hot.

In this particular embodiment, the initial rest shape is obtained at low temperature (outside the range of use) for example, under a carbonic gas ($CO_2$) jet. When passing from the low temperature to the ambient temperature of use, the shape memory material is flattened as can be seen in FIG. 2 so that transverse forces compress the supports 40 and 41 against each other, track against track.

The two faces 13 and 14 parallel to the supports 40 and 41 are flattened. The sides 15 and 16 are subjected to transverse forces which modify their shape. The resilient seal 50 is compressed and transmits the forces to the supports 40,41. It distributes these forces over the whole width of the guide 30 where the tracks 20,21 are situated.

The new shape which the sleeve 10 assumes is said to be active. The material used for the sleeve is, for example, a nickel and titanium based alloy.

To dismantle the connection, it is sufficient to cool it with $CO_2$ so that the sleeve resumes its initial shape.

In FIG. 3, the connector is shown in longitudinal section. The same elements bear the same references. In this FIG. 3, the connector is at rest. After positioning the support 40 through the opening 11 of the sleeve 10, the support 41 is slid over the support 40 through the opening 12 in the sleeve 10.

FIG. 4 shows a longitudinal section of the connector in its active phase. The resilient seal 50 is crushed and deformed under the action of the sleeve 10. The groove formed in the wedge-piece 51 is provided for receiving the deformed resilient seal 50.

The embodiment which has been described corresponds to the connection of two printed circuits. The invention also applies to the connection of a flat flexible cable 42 to a printed circuit 43 such as is shown in FIG. 5. The invention also applies to the connection of two flat flexible cables together.

What is claimed is:

1. A connector for flat connections adapted for connecting electrically together printed circuit tracks or printed circuit tracks to a flat cable or two flat cables together, said connector comprising:
    (a) a sleeve made from a shape memory material in which, during use, conducting elements are superimposed, said sleeve being adapted for applying transverse forces under the effect of a predetermined temperature so that electric continuity may be provided between the conducting elements, and
    (b) an elastic seal placed between a conducting element support and a face of said sleeve, said seal resting on a wedge-piece placed on one of the supports of the conducting elements.

2. A connector for flat connections adapted for connecting electrically together printed circuit boards, a printed circuit board and a flat cable, or two flat cables, the printed circuit boards and the flat cables including conducting elements to be connected, said conducting element being disposed on supports, said connector comprising:
    (a) a sleeve made from a shape memory material and having two parallel faces and two lateral sides connecting said faces together, the conducting elements to be connected being superimposed within said sleeve and situated in respective planes parallel to said faces during use of said connector;
    (b) a guide fixed to said sleeve for housing the supports for the conducting elements; and
    (c) an elastic seal which, during use of said connector, is placed between one of the conducting element supports and one of said faces of said sleeve,
    (d) said sleeve being sized and shaped so that said faces are able to draw closer together under the effect of a change of temperature and said lateral sides being elastically deformable under the effect of the change of temperature, thereby applying transverse forces on said elastic seal and on the supports so that electric continuity may be provided between the superimposed conducting elements.

3. A connector as claimed in claim 2 wherein said guide is fixed to said sleeve by adhesive.

4. A connector as claimed in claim 2 wherein said elastic seal is a cylindrical elastomer seal.

5. A connector as claimed in claim 4 and further comprising a wedge-piece which, during use of said connector, is placed on one of the supports within said guide for receiving said elastic seal.

* * * * *